United States Patent [19]

Olson

[11] 3,858,234

[45] Dec. 31, 1974

[54] TRANSISTOR HAVING IMPROVED SAFE OPERATING AREA

[75] Inventor: Richard O. Olson, Scottsdale, Ariz.

[73] Assignee: Motorola, Inc., Franklin Park, Ill.

[22] Filed: Jan. 8, 1973

[21] Appl. No.: 321,880

[52] U.S. Cl. .................................... 357/34, 357/86

[51] Int. Cl. ........................ H01l 11/00, H01l 15/00

[58] Field of Search...317/235 WW, 235 Z, 235 AB, 317/235 AE, 235 D

[56] References Cited

UNITED STATES PATENTS

| | | | |
|---|---|---|---|
| 3,243,669 | 3/1966 | Sah | 317/234 |
| 3,358,197 | 12/1967 | Scarlett | 317/235 |
| 3,465,213 | 9/1969 | Hugle | 317/235 |
| 3,510,735 | 5/1970 | Potter | 317/235 |
| 3,519,898 | 7/1970 | Nakatani | 317/235 |
| 3,543,394 | 12/1970 | Matlow | 29/584 |
| 3,629,667 | 12/1971 | Lubart et al. | 317/234 R |

*Primary Examiner*—Stanley D. Miller, Jr.
*Assistant Examiner*—Joseph E. Clawson, Jr.
*Attorney, Agent, or Firm*—Vincent J. Rauner; Willis E. Higgins

[57] ABSTRACT

A transistor having an emitter and base with contact surfaces lying substantially in the same plane and having an increased safe operating area is disclosed. It has an increased wattage rating without increasing the size of the transistor, achieved by providing a distributed pinch resistance in the base area between the emitter-base junction and the base ohmic contact of the transistor, the pinch resistor being formed by a diffusion of the same conductivity type as the emitter in the indicated base region.

9 Claims, 3 Drawing Figures

TRANSISTOR HAVING IMPROVED SAFE OPERATING AREA

BACKGROUND OF THE INVENTION

This invention relates to transistors in which the emitter and the base have contact surfaces lying in the same plane and which have an increased safe operating area for the same size of transistor, and it is an object of the invention to provide an improved transistor of this nature.

It is an ever present problem in the making of transistors to make them smaller and to increase the power or wattage output thereof. While perhaps leaving the size of the transistor the same it is a problem to increase the wattage that may be obtained therefrom. Another solution to this same problem has been disclosed in the application Ser. No. 138,219, Michael E. Craft, filed Apr. 8, 1971, entitled "Isolated contact" and assigned to the same assignee as the subject application.

The basic problem is one of economics involving the dimensions of the semiconductor chip, silicon for example. If the area of the silicon chip is large the cost is greater and thus the effort, constantly, is to reduce the amount of silicon used. It is of course always possible to make an ordinary transistor large enough to develop the power required but this is quite uneconomical. The size of the transistor should be reduced as much as it can be. The limit of the wattage that may be obtained from a transistor for a particular value or range of values of emitter to collector voltage may be defined as the safe operating area inasmuch as an attempt to obtain wattages above such a value results in secondary breakdown of the transistor. According to the invention, the safe operating area may be substantially increased, which is to say for the same emitter to collector voltage the wattage obtainable is substantially increased. To put it differently, if the output wattage is to remain the same for a particular emitter to collector voltage, the area of the transistor can be substantially reduced. It is a further object of the invention to provide a transistor achieving the beneficial results indicated.

It is a further object of the invention to achieve substantially increased power output of transistors in an improved manner, or with the same power output to substantially decrease the size thereof, without sacrificing other desirable features of the transistors.

It is a further object of the invention to provide an improved transistor of the nature indicated which is simple in form, efficient in operation and economical to manufacture.

It is a further object of the invention to provide an improved method of forming a transistor having an increased safe operating area at increased wattage outputs.

SUMMARY OF THE INVENTION

In carrying out the invention according to one form, there is provided a transistor comprising an emitter of one conductivity type, a base of the opposite conductivity type and a collector of the same conductivity type as the emitter, the emitter being surrounded by the base and forming a junction therewith, the emitter and the base having contact surfaces lying in the same plane, ohmic contact metallizations formed on each of said emitter and base, an isolation layer extending over the base emitter junction between said ohmic contact metallizations, and a current blocking region in said base between said base contact metallization and said emitter.

More specifically the current blocking region is a distributed pinch resistance created by diffusing a region of the same conductivity type as the emitter into the base region between the emitter and the base contact metallization.

DESCRIPTION OF THE PREFERRED EMBODIMENTS

Figure 1:
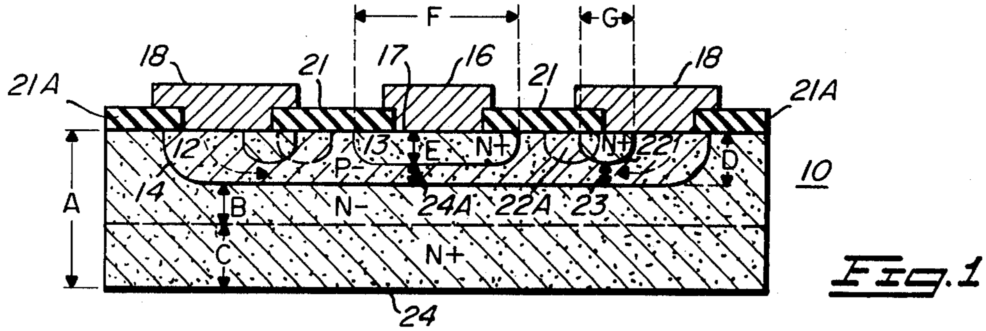
FIG. 1 is a sectional view, illustrating one form of transistor according to the invention.
Figure 2:
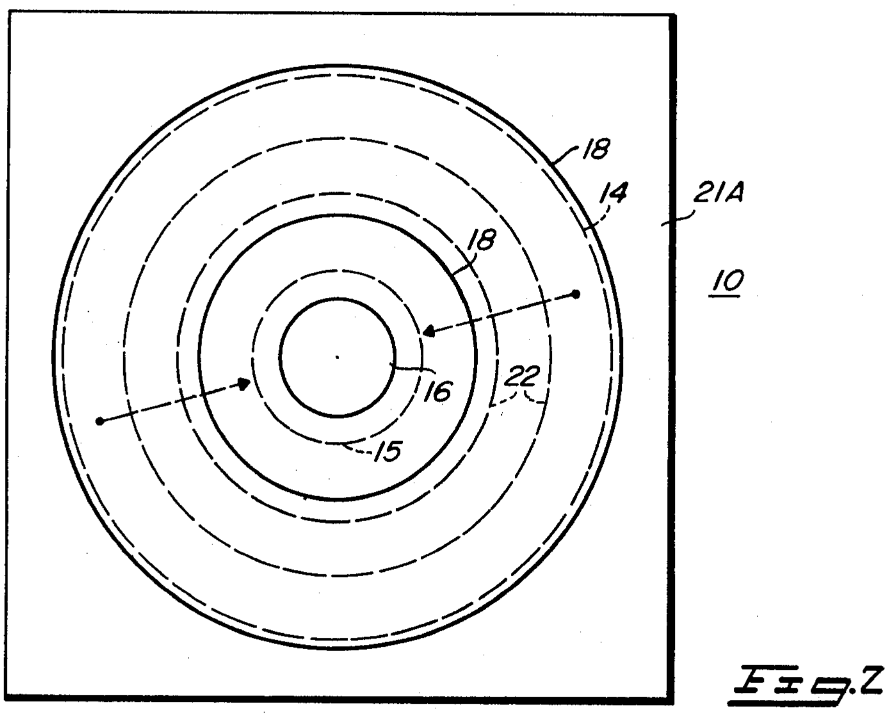
FIG. 2 is a top view of the device illustrated in FIG. 1.

Referring to FIGS. 1 and 2 of the drawings there is shown a planar bull's-eye type transistor 10 having an N collector 11, a P− ring base 12 surrounding a central N+ emitter 13, a junction 14 between the base and collector, and an emitter base junction 15.

While shown as a planar type structure it will be evident that the transistor 21 could be of some other form for example, mesa.

An ohmic metal contact 16 is formed on the N+ emitter at the surface 17 and an ohmic metal contact ring 18 is formed on the P− base at the surface 19, the surfaces 17 and 19 lying essentially in the same plane. Between and beyond the metallizations 16 and 18 there is an insulating layer 21, for example, of silicon dioxide, a portion 21A of the silicon dioxide layer extending to the edges of the transistor as shown. The insulating layer 21 overlies the portions of the emitter-base junction 15 which extends to the surface 17, 19. The base-collector junction 14 also extends to the surface 17, 19 and is overlaid by the insulating layer 21A as shown.

Between the base contact ring 18, particularly that portion thereof which contacts the surface 19 of the transistor, and the outer ring periphery of the emitter 15 there is an N+ diffusion ring 22. The diffusion ring 22 may be formed at the same time that the emitter is formed whereby the distance 23 between the bottom of the diffusion 22 and the base collector junction 14 is the same as the distance 24 between the bottom of the emitter 13 and the base collector junction 14.

While the diffusion 22 conveniently may be formed at the same time as the emitter 13, this is not necessarily required because the diffusion 22 may be formed separately if desired. Similarly the dopant concentration in the diffusion ring 22 may be different from that in the emitter 13, if the diffusion 22 is formed separately.

The diffusion 22 does not have the emitter voltage applied to it and thus stands as an area or volume which blocks the current flowing from the base contact ring 18 to the emitter 13 and the emitter contact 16. The effective pathway of the base region in the current path from the base contact ring 18 to the emitter contact 16 is thus defined by the volume of the base determined by the dimension 23. The dimension 23 thus determines the value of the resistance, i.e., pinch resistance, introduced into the base emitter current pathway. The presence of this pinch resistance stabilizes the current flow, particularly at high wattages at which the transistor may operate so as to prevent hot spots from developing at the base-emitter junction 15 and thus preventing secondary breakdown and destruction of the transistor. The pinch resistor 23 is removed a substantial distance from the base-emitter junction at the surfaces 17, 19 and the ring extremity of the base-emitter junction 15 and thus does not increase in temperature to the same extent as these extremity portions of the emitter-base junction during operation of the transistor. The tendency of the resistance of the emitter-base junction to decrease as the temperature of operation increases does not influence the resistance value of the pinch resistor 23 and it continues to operate as a stabilizing resistance to the current flow. Thus the tendency for hot spots to develop along the ring periphery of the base-emitter junction 15 is substantially reduced and may be completely eliminated. Accordingly the safe operating area of the transistor is substantially increased and may be increased by as much as fifty percent without increasing the size of the transistor for its normal operation.

While the diffusion 22 is shown in FIG. 1 as being underneath a portion of the base contact 18, this is exemplary only. As shown by the dotted line area, 22A, the diffusion may be disposed between the base contact 18 and the emitter-base junction 15 without engaging either one of them. Also, as shown the diffusion area 22A is completely underneath the insulating layer 21. It is necessary only that the diffusion be disposed so that a pinch resistor is created in the current path between the emitter-base junction and the base contact.

In power transistors the emitter current is high and the base current also may be high. Since the distance from the center of the emitter-base junction 15 to the inner edge of the base contact 18 is larger than the distance from the outer ring periphery of the emitter to the edge of the base contact, the resistance from the center of the emitter-base junction to the edge of base contact 18 is greater than the resistance from the periphery of the emitter-base junction. As is well known, small base currents flowing through the larger resistance value tend to bias off a substantial portion of the emitter whereby the emitter current is concentrated at the outer peripheral portions of the junction 15. This phenomenon is referred to as base crowding. In conventional power transistors the base contact 18 is in contact with the surface 19 which may include an enhancement diffusion (not shown) extending from the periphery of emitter 15 all the way to base contact 18 and there underneath. In this manner the base enhancement diffusion, which would be a P+ diffusion where the base is a P region, provides a pathway for the increased base current in this area and permits the value of beta to remain high for large values of collector current.

As current and power requirements are increased for the same size of transistor area, a point is reached at which secondary failure takes place in conventional transistors. In this case, evidently the base current flowing from the peripheral portions of the junction 15 to the base contact 18 ultimately overheats portions of the transistor and perhaps even melts the same thereby destroying it. According to the invention the P+ base enhancement region (diffusion) is not used except as an ohmic contact artifice at contact 18, but the diffusion region 22 is used to provide a pinch resistor 23 as described. The presence of the 50 23 having base current flowing therethrough causes a voltage drop in this area and forces the base current to utilize additional area of the emitter-base junction 15 between the outer periphery thereof and the remainder of the emitter. That is to say, the area of the emitter-base junction which supplies current to the base extends around from the periphery to a substantial extent. In this manner a greater portion of the P− base as well is utilized whereby additional amounts of power are obtainable from a transistor of a given dimension. As indicated above, for some power transistors fifty percent additional wattage may be obtained without experiencing secondary breakdown of the device. Inasmuch as the distributed pinch resistor 23 forces the emitter-base current to utilize additional portions of the emitter-base junction it acts as a ballast.

In FIGS. 1 and 2 an NPN transistor is shown but it will be understood that a PNP transistor may be formed in a similar manner. While the transistor of these figures has been described as an all diffused form of transistor after the basic material has been provided it will be understood that this is exemplary also, and where appropriate as understood by those skilled in the art, epitaxial layers may be used.

In a typical device, for example, the rating could be 3 amperes at 300 volts. The basic material or substrate could be of silicon about 172 microns thick, dimension A, of N− doping concentration, for example, such as to give a resistivity equal to 15–3 ohm-centimeters. The remaining N− layer after the collector, base and emitter are formed is illustrated by the dimension B which typically might be about 45 microns. The lowermost N+ layer 11 may be formed by a diffusion into the surface 24, the surface concentration of the diffusion being greater than $10^{20}$ atoms per cubic centimeter typically. Thus the N+ layer shown by the dimension C may have a thickness of about 110 microns. The N− and N+ layers comprising the layer 11 form the collector of the transistor as will be understood.

As will be understood also, a layer of isolating or masking material such as silicon dioxide 21 is deposited on the surfaces 17, 19 of the substrate and appropriate windows are formed therein by well known masking and etching techniques followed by diffusing the base layer 12 into the substrate. P type doping for example, boron, is diffused into the surfaces 17, 19 until the dimension D, depth of the base layer, is about 27 microns in extent. The surface concentration of the dopant may be of the order of $1 \times 10^{18}$ atoms per cubic centimeter giving a sheet resistance of about 100 ohms per square at the surfaces 17, 19.

The base layer 12 in the first instance, of course, may be a complete diffusion including that which ultimately becomes the emitter 13 and the blocking region 22. After the base layer 12 has been diffused, further silicon dioxide layers 21 may be applied, and windowed by well known masking and etching techniques. Thereafter the base 13 and the blocking layer 22 are diffused into the base layer 12. The emitter 13 and the blocking region 22 may be diffused as one step if desired. Thus the emitter 13 and the blocking layer 22 will be of N+ dopant concentration wherein the surface concentration during the diffusion step will be of the order of the $10^{20}$ atoms per cubic centimeter of any desired N type dopant. The dimension E, depth of the emitter, may be about 13 microns thereby leaving the dimensions 23 and 24 of the base about 14 microns. After the emitter and blocking ring 22 diffusions have been made the surface 17, 19 are again covered with a layer of silicon dioxide which again is windowed by appropriate and well known masking and etching techniques to form openings into which the emitter contact 16 and the base contact ring 18 are formed such as by evaporating aluminum metal film into the window areas.

The diameter F of the emitter 13 may be about 50 mils, the radial extent, dimension G of the blocking ring may be about 1–2 mils and the overall lateral dimension of the transmitter may be about 70 mils.

It will be understood that these dimensions are typical and other dimensions may be selected to meet particular requirements.

Figure 3:
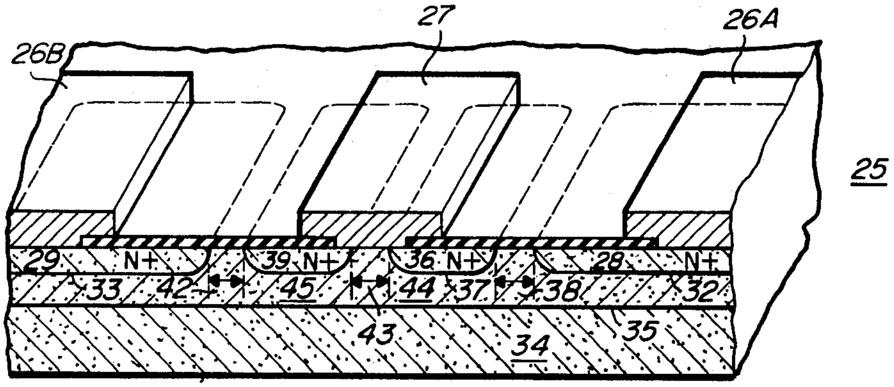
FIG. 3 is a sectional view in perspective and on a different scale of a modified form of transistor according to the invention.

In FIG. 3 there is shown a form of the invention wherein the transistor 25 has interdigitated finger forms of emitter contacts 26A, 26B and base contacts 27. While only two emitter contacts 26A, 26B and one base contact 27 are shown it will be understood that as many such contacts will be provided as are necessary to contact the respective emitter and base portions.

Underneath the emitter contacts 26A, 26B are respectively N+ emitters 28 and 29. Underneath the base contact 27 is the base 31 into which the emitters 28 and 29 are diffusions similar to the structure as described in connection with FIGS. 1 and 2. The emitter-base junctions are defined by the reference characters 32 and 33. Underneath the base 31 is the N collector 34 the collector-base junction being identified by the reference character 35.

The base 31 and the collector 34 may be diffusions also as described in connection with FIGS. 1 and 2. Between the base contact 27 and the emitter 28 within the base 31 is an N+ diffusion 36 which may be of the same dopant concentration and depth as the emitter 28. As described in connection with FIG. 1, the junction 37 between N+ diffusion 36 and base 31 terminates short of the emitter-base junction 32 leaving a base portion 38. While the diffusion 36 is shown in contact with the base contact 27 this is not necessary as has been described in connection with FIGS. 1 and 2.

Between the base contact 27 and the emitter 29 there is an N+ diffusion 39 which may be of the same dopant concentration as the emitter 29 and of the same depth as already described in connection with corresponding other structural components. All of the emitter diffusions and the diffusions 36 and 39 may be formed at the same time and with one mask as will be understood. The diffusion 39 includes a junction 41 with the base 31. The junction 41 terminates short of the junction 33 thereby defining a base portion 42. Between the adjacent extremities of the diffusions 36 and 39 is a base portion 43. The base portion 44 underneath the N+ diffusion 36 and the base portion 45 underneath the N+ diffusion 39 form pinch resistors between the base contact 27 and the emitters 28 and 29, respectively, as has been described in connection with FIGS. 1 and 2.

It will be understood that the relative dimensions shown in the drawing of FIG. 3 are not necessarily representative of dimensions in an actual device but are diagrammatic showings of the location of various parts which are part of the invention. The dimensions of one device have been given in connection with FIGS. 1 and 2. In any event, as already explained, the base portions 44 and 45 are pinch resistors created by the N+ diffusions of the same conductivity type as the emitters 28 and 29 and thus form distributed resistors in the pathway of current flowing between the base contact 27 and the emitters 28 and 29. The pinch resistors 44 and 45 remove a substantial portion of the conductivity of the base and the current flowing in the path indicated is forced to utilize other portions of the emitter base junctions 32 and 33 other than those which are closest to the base contact 27. The presence of the pinch resistors thus stabilizes the current and increases the current values at which the phenomena of secondary breakdown occur. By virtue of the increase in current of the secondary breakdown the power or load capacity of the transistor may be as much as doubled over that of a transistor which does not include blocking diffusions of the nature of the diffusions 36 and 39.

While in the foregoing descriptions, various of the layers have been referred to as being formed by diffusion, it will be understood that in particular cases certain of the regions may be formed epitaxially.

I claim:

1. A transistor comprising an emitter of one type conductivity, a base of the opposite conductivity type having a bottom and a collector of the same conductivity type as the emitter, the emitter being surrounded by the base and forming a junction therewith, said emitter and said base having contact surfaces lying in the same plane, ohmic contact metallizations formed on each of said emitter and base, an isolation layer extending over the base emitter junction between said ohmic contact metallizations and a current blocking region surrounding said emitter, of like conductivity type thereto, extending into said base toward its bottom, and forming a pinch resistance between said current blocking region and the bottom of said base, in the path of current flow in said base between said base contact metallization and said emitter.

2. A transistor according to claim 1 wherein said emitter is of N conductivity type and said current blocking region is of N conductivity type.

3. A transistor according to claim 2 wherein said current blocking region is a diffused region.

4. A transistor according to claim 1 wherein said emitter is of P conductivity type and said current blocking region is of P conductivity type.

5. A transistor according to claim 4 wherein said current blocking region is a diffused region.

6. A transistor according to claim 2 wherein said emitter is of N+ dopants concentration.

7. A transistor according to claim 4 wherein said emitter is of P+ dopant concentration.

8. A transistor according to claim 1 wherein said emitter comprises a central diffused region and, said base comprises a ring diffused region.

9. A transistor according to claim 1 wherein said emitter and said base comprises a series of interdigitated parallel finger diffused regions.

* * * * *